(12) United States Patent
Lim et al.

(10) Patent No.: US 12,682,975 B2
(45) Date of Patent: Jul. 14, 2026

(54) STORAGE DEVICE FOR SUPPORTING DYNAMIC ALLOCATION OF MEMORY AND METHOD OF OPERATING THE SAME

(71) Applicant: SK hynix Inc., Icheon-si (KR)

(72) Inventors: Tae Ho Lim, Icheon-si (KR); Ie Ryung Park, Icheon-si (KR); Dong Sop Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 164 days.

(21) Appl. No.: 18/482,464

(22) Filed: Oct. 6, 2023

(65) Prior Publication Data

US 2024/0331790 A1 Oct. 3, 2024

(30) Foreign Application Priority Data

Mar. 31, 2023 (KR) ........................ 10-2023-0042499

(51) Int. Cl.
G11C 29/18 (2006.01)
G11C 29/00 (2006.01)
G11C 29/02 (2006.01)

(52) U.S. Cl.
CPC ............ G11C 29/18 (2013.01); G11C 29/006 (2013.01); G11C 29/021 (2013.01)

(58) Field of Classification Search
CPC ..... G11C 29/18; G11C 29/006; G11C 29/021; G11C 2029/0409; G11C 29/52; G06F 3/0631; G06F 3/0604; G06F 3/0614; G06F 3/0658; G06F 3/0659; G06F 2212/1016; G06F 2212/7202
See application file for complete search history.

(56) References Cited

U.S. PATENT DOCUMENTS

| | | | | |
|---|---|---|---|---|
| 7,580,924 B1* | 8/2009 | Ling | ...................... | G06Q 10/10 |
| 2006/0267577 A1* | 11/2006 | Erez | ................ | G11C 29/56008 |
| | | | | 324/759.03 |
| 2012/0196386 A1* | 8/2012 | Kim | ........................ | H01L 22/20 |
| | | | | 438/10 |
| 2020/0119736 A1* | 4/2020 | Weber | .............. | H03K 19/17756 |

FOREIGN PATENT DOCUMENTS

| | | |
|---|---|---|
| KR | 10-2013-0044657 A | 5/2013 |
| KR | 10-2014-0107890 A | 9/2014 |

* cited by examiner

*Primary Examiner* — Mohammed A Bashar

(57) ABSTRACT

Provided herein may be a storage device for supporting dynamic allocation of memory and a method of operating the same. The storage device may include a plurality of memory dies, a state detector configured to detect respective memory states of the plurality of memory dies, a memory information storage configured to store defect information that is information about memory dies in which defects have occurred among the plurality of memory dies, and a memory controller configured to, in response to a memory die allocation request for performing an operation corresponding to an externally provided operation request, determine allocation of a memory die based on a result of comparison between each detected memory state and the defect information.

16 Claims, 11 Drawing Sheets

| | Low Voltage | Normal Voltage | High Voltage |
|---|---|---|---|
| Die 1 | PASS | PASS | FAIL (ADDR1) |
| Die 2 | FAIL (ADDR2) | FAIL (ADDR3) | PASS |
| Die 3 | PASS | PASS | PASS |
| ⋮ | | | |
| Die N−1 | PASS | PASS | PASS |
| Die N | FAIL (ADDR4) | FAIL (ADDR5) | FAIL (ADDR6) |

|  | Low Temperature | Normal Temperature | High Temperature |
|---|---|---|---|
| Die 1 | PASS | PASS | PASS |
| Die 2 | PASS | PASS | FAIL (ADDR1') |
| Die 3 | FAIL (ADDR2') | PASS | FAIL (ADDR3') |
| ⋮ |  |  |  |
| Die N-1 | PASS | FAIL (ADDR4') | PASS |
| Die N | FAIL (ADDR5') | FAIL (ADDR6') | FAIL (ADDR7') |

| Die 1 | LOW VOLTAGE | NORMAL VOLTAGE | HIGH VOLTAGE |
|---|---|---|---|
| LOW TEMPERATURE | FAST | FAST | SLOW |
| NORMAL TEMPERATURE | NORMAL | FAST | FAST |
| HIGH TEMPERATURE | NORMAL | NORMAL | FAST |

:

| Die N | LOW VOLTAGE | NORMAL VOLTAGE | HIGH VOLTAGE |
|---|---|---|---|
| LOW TEMPERATURE | SLOW | FAST | FAST |
| NORMAL TEMPERATURE | FAST | FAST | FAST |
| HIGH TEMPERATURE | NORMAL | FAST | FAST |

STORAGE DEVICE FOR SUPPORTING DYNAMIC ALLOCATION OF MEMORY AND METHOD OF OPERATING THE SAME

CROSS-REFERENCE TO RELATED APPLICATION

The present application claims priority under 35 U.S.C. § 119(a) to Korean patent application number 10-2023-0042499 filed on Mar. 31, 2023, in the Korean Intellectual Property Office, the entire disclosure of which is incorporated by reference herein.

BACKGROUND

1. Technical Field

Various embodiments of the present disclosure relate to an electronic device, and more particularly to a storage device for supporting dynamic allocation of a memory and a method of operating the storage device.

2. Related Art

A storage device is a device that stores data under the control of a host device such as a computer or a smartphone. The storage device may include a memory device, which stores data and a memory controller, which controls the memory device. Memory devices may be classified into volatile memory devices and nonvolatile memory devices.

A volatile memory device may be a memory device in which data is stored only when power is supplied and in which stored data is lost when the power supply is interrupted. Examples of a volatile memory device may include a static random access memory (SRAM) and a dynamic random access memory (DRAM).

A nonvolatile memory device may be a memory device in which stored data is retained even when the supply of power is interrupted. Examples of a nonvolatile memory device may include a read only memory (ROM), a programmable ROM (PROM), an electrically programmable ROM (EPROM), an electrically erasable and programmable ROM (EEPROM), and a flash memory.

A bad (defective) memory that results from processing parameters may be identified through a wafer test process. The defective memory may include defective memory cells. Among defective memories, a defective memory that occurs at a specific temperature or at a specific voltage level may still be normally operated under other conditions. Therefore, when a memory operating environment is monitored, a defective memory may be used in environments other than at a specific temperature or a specific voltage level when the defective memory would otherwise not be used.

SUMMARY

Various embodiments of the present disclosure are directed to a storage device that is capable of dynamically allocating a memory depending on process, voltage, and temperature (PVT) changes and a method of operating the storage device.

An embodiment of the present disclosure may provide for a storage device. The storage device may include a plurality of memory dies, a state detector configured to detect memory states of the plurality of memory dies, a memory information storage configured to store defect information for memory dies, from among the plurality of memory dies, in which defects have occurred, and a memory controller configured to, in response to a memory die allocation request for performing an operation corresponding to an externally provided operation request, determine allocation of a memory die based on a comparison between a detected memory state and the defect information.

An embodiment of the present disclosure may provide for a controller. The controller may include a memory information storage configured to store defect information related to an address of a memory die in which a defect has occurred based on a result of a wafer test and a memory condition in which the defect has occurred in the memory die, a state detector configured to detect a temperature of a storage device and an operating voltage applied to the storage device, a memory controller configured to allocate memory dies in which no defects have occurred at the temperature or the operating voltage based on the temperature, the operating voltage, and the defect information, and an error detector configured to perform an error correction operation on a memory die in which a defect has occurred in an additional memory condition different from the memory condition, from among memory dies in which no defects have occurred in the memory condition.

An embodiment of the present disclosure may provide for a method of operating a controller. The method may include monitoring a temperature of a storage device and an operating voltage applied to the storage device, checking addresses of memory dies in which defects have occurred at the monitored temperature and voltage, based on at least one of the monitored temperature and voltage, and allocating memory dies other than the memory dies in which the defects have occurred.

BRIEF DESCRIPTION OF THE DRAWINGS

FIG. 4 is a diagram illustrating a defect information table according to an embodiment of the present disclosure.

FIG. 5 is a diagram illustrating a defect information table according to an embodiment of the present disclosure.

FIG. 6 is a diagram illustrating a defect information table according to an embodiment of the present disclosure.

FIG. 7 is a diagram illustrating a process of dynamically allocating memory dies based on temperature according to an embodiment of the present disclosure.

FIG. 8 is a diagram illustrating a process of dynamically allocating memory dies based on voltage according to an embodiment of the present disclosure.

FIG. 9 is a diagram illustrating a process of dynamically allocating memory dies based on temperature and voltage according to an embodiment of the present disclosure.

DETAILED DESCRIPTION

Specific structural or functional descriptions in embodiments of the present disclosure introduced in this specification or application are provided as examples to describe embodiments according to the concepts of the present disclosure. The embodiments according to the concepts of the present disclosure may be practiced in various forms, and should not be construed as being limited to the embodiments described in the specification or application.

Figure 1:
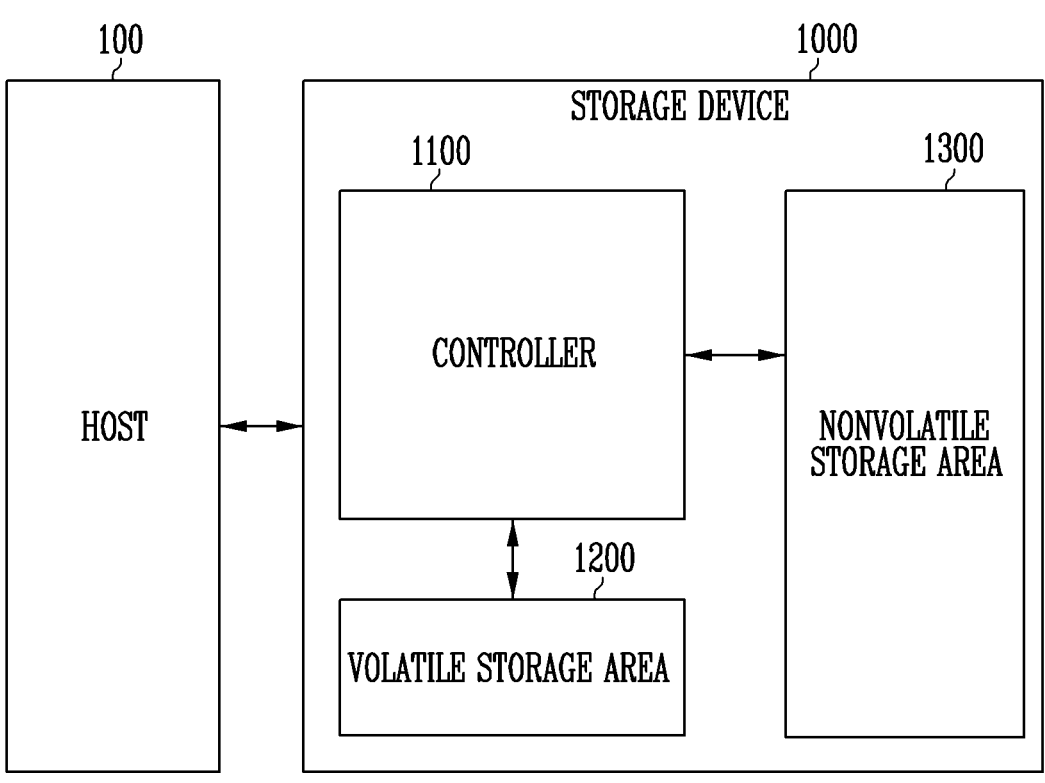
FIG. 1 is a diagram illustrating a storage device according to an embodiment of the present disclosure.

FIG. 1 is a diagram illustrating a storage device according to an embodiment of the present disclosure.

Referring to FIG. 1, a storage device 1000 may include a controller 1100, a volatile storage area 1200, and a nonvolatile storage area 1300.

The storage device 1000 may be connected to and used by a host 100. The host 100 may include external devices such as a mobile phone, a smartphone, a laptop computer, a desktop computer, a TV, a game console, a tablet PC, an in-vehicle infotainment system, a drone, and an autonomous vehicle. The host 100 may store data in the nonvolatile storage area 1300 by controlling the storage device 1000.

The storage device 1000 may be manufactured as any one of various types of storage devices depending on a host interface that is a scheme for communication with the host 100. For example, the storage device 1000 may be implemented as any one of various types of storage devices, for example, a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 1000 may be manufactured in any one of various types of package forms. For example, the storage device 1000 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The storage device 1000 may include the nonvolatile storage area 1300. The nonvolatile storage area 1300 may be composed of a plurality of nonvolatile memory dies. The nonvolatile storage area 1300 may store data. The nonvolatile storage area 1300 is operated under the control of the controller 1100. Each nonvolatile memory die may include a memory cell array including a plurality of memory cells, which store data. The memory cell array may include a plurality of memory blocks. Each memory block may include a plurality of memory cells. One memory block may include a plurality of pages.

In an embodiment, a page may be the unit by which data is programmed to the nonvolatile storage area 1300 or by which data stored in the nonvolatile storage area 1300 is read. A memory block may be the unit by which data stored in the nonvolatile storage area 1300 is erased.

In an embodiment, the nonvolatile storage area 1300 takes many alternative forms, such as a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM). In the present specification, for convenience of description, nonvolatile memory dies included in the nonvolatile storage area 1300 are assumed to be NAND flash memories.

The volatile storage area 1200 may temporarily store data received from the host 100 or provided from the nonvolatile storage area 1300. Further, the volatile storage area 1200 may temporarily store metadata (e.g., mapping tables) present in the nonvolatile storage area 1300. The volatile storage area 1200 may be composed of a plurality of volatile memory dies. The volatile storage area 1200 may include volatile memory dies such as DRAM, SDRAM, DDR SDRAM, LPDDR SDRAM, and GRAM.

Furthermore, the volatile storage area 1200 may include nonvolatile memory dies such as FRAM, ReRAM, STT-MRAM, and PRAM. In an embodiment, the volatile storage area 1200 may be included in the controller 1100.

The controller 1100 may control the overall operation of the storage device 1000.

The controller 1100 may control the nonvolatile storage area 1300 so that a program operation, a read operation or an erase operation is performed in response to a request received from the host 100. When a program operation is performed, the controller 1100 may provide a program command and data to the nonvolatile storage area 1300. When a read operation is performed, the controller 1100 may provide a read command to the nonvolatile storage area 1300. When an erase operation is performed, the controller 1100 may provide an erase command to the nonvolatile storage area 1300.

The nonvolatile storage area 1300 may receive a command and an address from the controller 1100, and may access the area of the memory cell array, selected by the address. That is, the nonvolatile storage area 1300 may perform an operation corresponding to the command on the area selected by the address. For example, the nonvolatile storage area 1300 may perform a program operation, a read operation, and an erase operation.

During a program operation, the nonvolatile storage area 1300 may program data to the area selected by the address. During a read operation, the nonvolatile storage area 1300 may read data from the area selected by the address. During an erase operation, the nonvolatile storage area 1300 may erase data stored in the area selected by the address.

When power is applied to the storage device 1000, the controller 1100 may run firmware (FW). When the nonvolatile storage area 1300 is implemented as a flash memory device, the controller 1100 may run firmware such as a flash translation layer (FTL) for controlling communication between the host 100 and the nonvolatile storage area 1300. When power is applied to the storage device 1000, the controller 1100 may read data required for booting the storage device 1000 from a ROM (not illustrated).

The controller 1100 may communicate with the host 100. In an embodiment, the controller 1100 may communicate with the host 100 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), nonvolatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
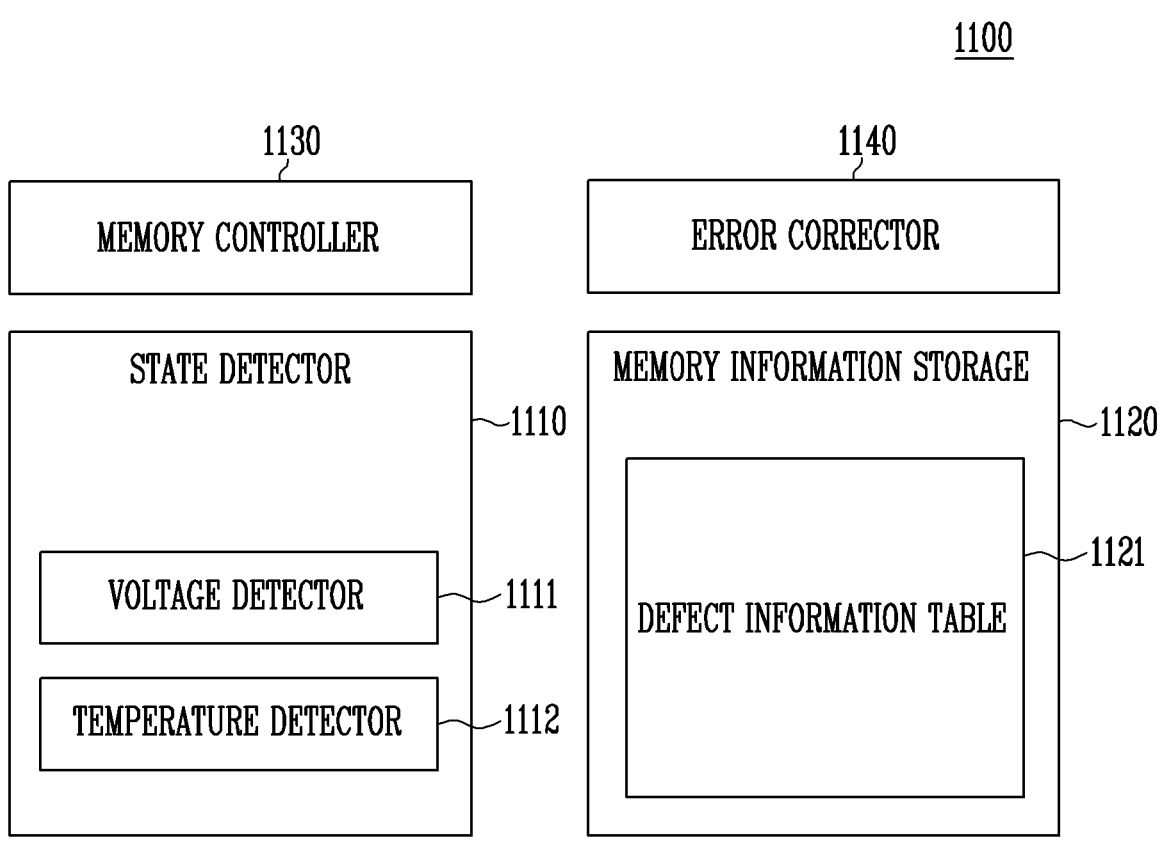
FIG. 2 is a diagram illustrating a controller according to an embodiment of the present disclosure.

FIG. 2 is a diagram illustrating a controller according to an embodiment of the present disclosure.

Referring to FIG. 2, a controller 1100 may include a state detector 1110, a memory information storage 1120, a memory controller 1130, and an error corrector 1140.

The state detector 1110 may monitor a memory condition (memory state) of a storage device 1000 illustrated in FIG. 1. The memory condition may include the temperature of the storage device 1000 illustrated in FIG. 1, voltages applied to a plurality of memory dies, externally applied voltages, etc.

In an embodiment, the state detector 1110 may monitor the memory condition in real time. Further, the state detector 1110 may monitor the memory condition at preset intervals. In addition, the state detector 1110 may monitor the memory condition at a point at which a plurality of memory dies are to be allocated for operation.

The state detector 1110 may include a voltage detector 1111 and a temperature detector 1112.

The voltage detector 1111 may detect a voltage, and may generate voltage information based on the detected voltage. For example, the voltage detector 1111 may detect the level of a voltage applied to a memory die to perform an operation, and may generate voltage information including information about the level to which the detected voltage level belongs, such as any one of a low voltage, a normal voltage, and a high voltage. The levels of low voltage, normal voltage, and high voltage may be relative levels for distinguishing the levels of the operating voltages based on a preset reference value.

The temperature detector 1112 may detect the temperature of the storage device 1000 illustrated in FIG. 1, and may generate temperature information based on the detected temperature. The temperature detector 1112 may include a temperature sensor for detecting temperature. For example, the temperature detector 1112 may detect the temperature of the operating environment of the storage device 1000, and may generate temperature information including information about the level to which the detected temperature level belongs, such as any one of low temperature, normal temperature, and high temperature. The levels of low temperature, normal temperature, and high temperature may be relative levels for distinguishing the ranges of the operating temperature of the storage device 1000 based on a preset reference value. However, the present disclosure is not limited to such embodiments, and the ranges of temperature or voltage may be further subdivided and separated.

The memory information storage 1120 may include a defect information table 1121 that includes information about a memory die in which a defect has occurred, that is, a defective memory die. The defect information table 1121 may be stored in a nonvolatile memory area.

Among the volatile memory dies or nonvolatile memory dies, defective memory dies may be identified through a wafer test process. The wafer test process may include a cell test operation, in which a plurality of memory cells included in volatile memory dies or nonvolatile memory dies are tested for defects. The wafer test may include a process of determining whether memory cells are defective while changing the operating environment. For example, the wafer test may include a procedure of determining whether memory cells are defective while changing the operating temperature, and may include a procedure of determining whether the memory cells are defective while changing the operating voltage. Furthermore, during the wafer test process, process information indicating whether memory cells are in a fast-operating state or in a slow-operating state, depending on process parameters, may be checked.

The defect information table 1121 may store defect information related to a defective memory die in which a defect occurs as a result of the above-described wafer test. Details of the defect information table 1121 will be described later with reference to FIGS. 4 to 6.

The memory controller 1130 may allocate memory dies required for operation in response to an external operation request. In an example, the memory controller 1130 may allocate some of the plurality of memory dies included in the volatile storage area 1200 illustrated in FIG. 1, such as allocating a buffer memory required for operation. In an example, the memory controller 1130 may allocate all of the plurality of memory dies included in the volatile storage area 1200 illustrated in FIG. 1 to allocate a buffer memory required for operation.

The memory controller 1130 may determine memory dies to be allocated based on both a memory condition obtained at the time at which the memory dies required for operation are allocated and the defect information provided by the memory information storage 1120.

In an embodiment, the memory controller 1130 may receive the memory condition, which is obtained at the time at which the memory dies required for operation are allocated, from the state detector 1110. Furthermore, the memory controller 1130 may analyze the received memory condition and the defect information, and may then allocate memory dies accordingly. For example, the memory controller 1130 may allocate memory dies in which no defects have occurred under the memory condition, which is obtained at the time at which the memory dies required for operation are allocated.

For example, when the current memory condition received from the state detector 1110 is a low-temperature environment, the memory controller 1130 may exclude from allocation any memory dies in which defects have occurred in a low-temperature environment. Using this defect information, memory dies in which defects have occurred under the memory condition are not allocated.

The memory controller 1130 may update information about defective memory cells. The memory controller 1130 may update the defect information table 1121 related to defective memory cells.

In an embodiment, even in memory cells in which no defects have occurred during the wafer test process, defects may occur in a process of operating the memory cells. For example, during the wafer test process, even if no defects have occurred in memory cells when determining whether memory cells are defective or non-defective while changing the operating temperature, defects may occur at specific operating temperatures in the actual operating environment. In another example, during the wafer test process, even if no defects have occurred in memory cells when determining whether memory cells are defective or non-defective while changing the operating voltage, defects may occur at specific operating voltages in the actual operating environment.

The memory controller 1130 may update the defect information table 1121 for memory cells in which defects have occurred in the actual operating environment, including the conditions in which the defects have occurred. Memory cells in which defects have occurred in the actual operating environment may be memory cells on which a program operation has failed a preset number or more times. Further, memory cells in which defects have occurred in the actual operating environment may be memory cells on which a read operation has failed a preset number or more times.

The error corrector 1140 may perform an error correction operation.

The error corrector 1140 may perform error correction code (ECC) encoding based on data to be written to the nonvolatile storage area 1300. Further, the error corrector 1140 may perform error correction code (ECC) decoding on data received from the nonvolatile storage area 1300.

In an embodiment, it may be necessary or desirable to allocate memory dies, in which defects have occurred, for an operation. For example, memory dies that have defects under a memory condition that is different from the memory condition obtained at the time at which memory dies are allocated may be selected for allocation. In such instances, the allocated memory dies have no defects that have occurred in the memory condition obtained at the time at which memory dies are allocated, and the error corrector 1140 may perform an error correction operation on data to be stored in the allocated memory dies.

Figure 3:
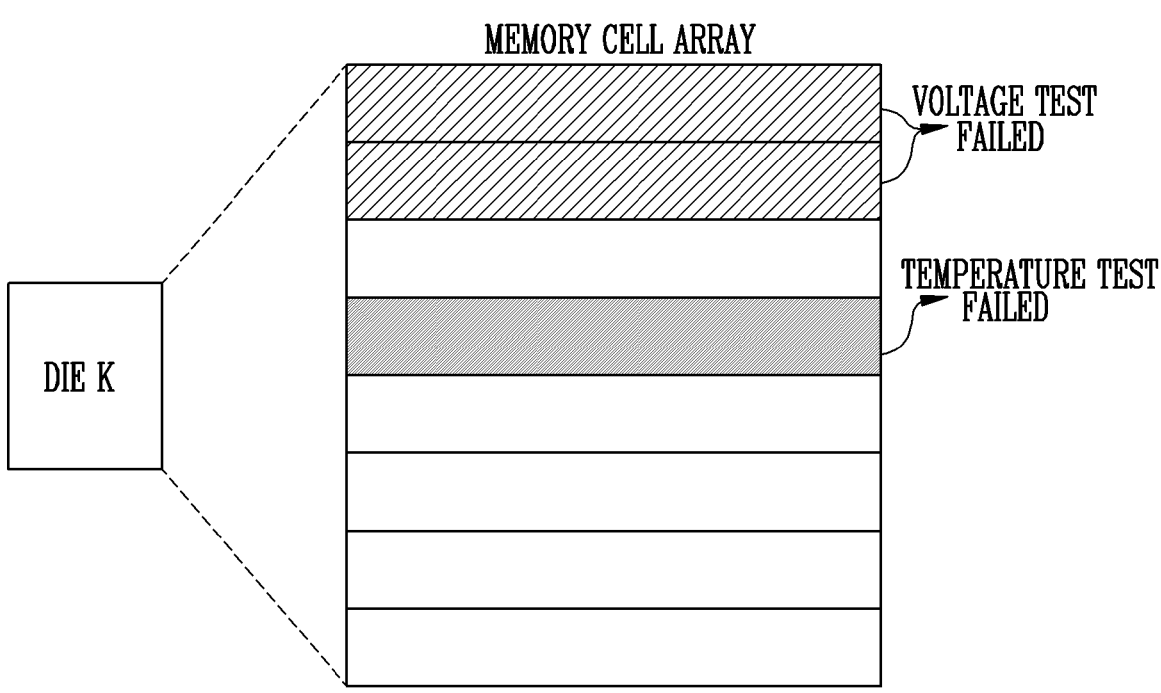
FIG. 3 is a diagram illustrating a memory die in which defects occur according to an embodiment of the present disclosure.

FIG. 3 is a diagram illustrating a memory die in which defects occur according to an embodiment of the present disclosure.

Referring to FIG. 3, a memory die (Die K) may include defective memory cells that have failed in a voltage test and defective memory cells that have failed in a temperature test.

The memory die (Die K) may include a memory cell array including a plurality of memory cells.

In an embodiment, among memory cells included in the memory die (Die K), defective memory cells may be identified through a wafer test. Among the memory cells included in the memory die (Die K), the defective memory cells that have failed in the voltage test may be memory cells in which no defects have occurred due to a change in another condition (e.g., temperature). Similarly, among the memory cells included in the memory die (Die K), defective memory cells that have failed in the temperature test may be memory cells in which no defects have occurred due to a change in another condition (e.g., voltage).

In other words, the defective memory cells, having failed in the voltage test, may be operated as normal memory cells unless they are operating at the voltage level at which defects occurred. Other defective memory cells, having failed in the temperature test, may be operated as normal memory cells unless they are operating at the temperature level at which defects occurred.

Furthermore, among the memory cells included in the memory die (Die K), memory cells that have passed the voltage test and the temperature test may be operated as normal memory cells.

Therefore, even though defective memory cells are present among the memory cells included in the memory die (Die K), the memory controller 1130 illustrated in FIG. 2 may allocate the memory die (Die K) for use unless the memory die (Die K) is used in the specific environment or condition in which defects have occurred in the memory cells.

In an embodiment, the memory cells included in the memory die (Die K) may be identified as defective memory cells during an operating process. Even though the memory cells included in the memory die (Die K) are not identified as defective memory cells in the wafer test process, defects may occur during an operating process.

FIG. 4 is a diagram illustrating a defect information table according to an embodiment of the present disclosure.

Referring to FIG. 4, a defect information table 1121 may include defect information depending on different voltage environments.

The defect information table 1121 may include information about the level of the voltage at which the defect has occurred in the defective memory die. Although not illustrated in FIG. 4, the defect information table 1121 may also include information about the address of a defective memory die in which a defect has occurred during a process of performing a wafer test while changing the operating voltage; the address of a memory block in which the defect has occurred among a plurality of memory blocks included in the defective memory die; the address of a page in which the defect has occurred among a plurality of pages included in the defective memory die; and the address of memory cells in which the defect has occurred among a plurality of memory cells included in the defective memory die.

Among the pieces of defect information stored in the defect information table 1121, pieces of defect information depending on voltage may include information about whether defects have occurred in respective memory dies in low voltage, normal voltage, and high voltage environments. Low voltage, normal voltage, and high voltage may be relative levels for distinguishing the operating voltages based on a preset reference value.

In an embodiment, as a result of performing a cell test on memory cells in a low-voltage operating environment, memory dies in which defects have occurred may be a second memory die (Die 2) and an N-th memory die (Die N). As a result, for memory cells included in the second memory die (Die 2), the defect information table 1121 may include the address of the second memory die (Die 2) and the address ADDR2 of memory cells in which defects have occurred in the low-voltage operating environment. Similarly, for memory cells included in the N-th memory die (Die N), the defect information table 1121 may include the address of the N-th memory die (Die N) and the address ADDR4 of memory cells in which defects have occurred in the low-voltage operating environment among memory cells included in the N-th memory die (Die N).

In an embodiment, as a result of performing a cell test on memory cells in a normal-voltage operating environment, memory dies in which defects have occurred may be a second memory die (Die 2) and an N-th memory die (Die N). As a result, for memory cells included in the second memory die (Die 2), the defect information table 1121 may include the address of the second memory die (Die 2) and the address ADDR3 of memory cells in which defects have occurred in the normal-voltage operating environment. Similarly, for memory cells included in the N-th memory die (Die N), the defect information table 1121 may include the address of the N-th memory die (Die N) and the address ADDR5 of memory cells in which defects have occurred in the normal-voltage operating environment.

In an embodiment, as a result of performing a cell test on memory cells in a high-voltage operating environment, memory dies in which defects have occurred may be a first memory die (Die 1) and an N-th memory die (Die N). Consequently, for memory cells included in the first memory die (Die 1), the defect information table 1121 may include the address of the first memory die (Die 1) and the address ADDR1 of memory cells in which defects have occurred in the high-voltage operating environment. Similarly, for memory cells included in the N-th memory die (Die N), the defect information table 1121 may include the address of the N-th memory die (Die N) and the address ADDR6 of memory cells in which defects have occurred in the high-voltage operating environment.

Further, referring to FIG. 4, a third memory die (Die 3) and an N−1-th memory die (Die N−1) may be normal memory dies in which no defects have occurred even though the operating voltage changes.

FIG. 5 is a diagram illustrating a defect information table according to an embodiment of the present disclosure.

Referring to FIG. 5, a defect information table 1121 may include defect information depending on temperature.

The defect information table 1121 may include information about the level of the temperature at which the defect has occurred in the defective memory die. Although not illustrated in FIG. 5, the defect information table 1121 may include information about the address of a defective memory die in which a defect has occurred during a process of performing a wafer test while changing operating temperature; the address of a memory block in which the defect has occurred among a plurality of memory blocks included in the defective memory die; the address of a page in which the defect has occurred among a plurality of pages included in the defective memory die; and the address of memory cells in which the defect has occurred among a plurality of memory cells included in the defective memory die.

Among the pieces of defect information stored in the defect information table 1121, pieces of defect information depending on temperature may include information about whether defects have occurred in respective memory dies in low temperature, normal temperature, and high temperature environments. The low temperature, normal temperature, and high temperature may be relative levels for distinguishing the operating temperatures based on a preset reference value.

In an embodiment, as a result of performing a cell test on memory cells in a low-temperature operating environment, memory dies in which defects have occurred may be a third memory die (Die 3) and an N-th memory die (Die N). As a result, for memory cells included in the third memory die (Die 3), the defect information table 1121 may include the address of the third memory die (Die 3) and the address ADDR2' of memory cells in which defects have occurred in the low-temperature operating environment. Similarly, for memory cells included in the N-th memory die (Die N), the defect information table 1121 may include the address of the N-th memory die (Die N) and the address ADDR5' of memory cells in which defects have occurred in the low-temperature operating environment.

In an embodiment, as a result of performing a cell test on memory cells in the normal temperature operating environment, dies in which defects have occurred may be an N–1-th memory die (Die N–1) and the N-th memory die (Die N). Consequently, for memory cells included in the N–1-th memory die (Die N–1), the defect information table 1121 may include the address of the N–1-th memory die (Die N–1) and the address ADDR4' of memory cells in which defects have occurred in a normal temperature operating environment. Similarly, for memory cells included in the N-th memory die (Die N), the defect information table 1121 may include the address of the N-th memory die (Die N) and the address ADDR6' of memory cells in which defects have occurred in the normal-temperature operating environment.

In an embodiment, as a result of performing a cell test on memory cells in a high-temperature operating environment, memory dies in which defects have occurred may be a second memory die (Die 2), a third memory die (Die 3), and an N-th memory die (Die N). As a result, for memory cells included in the second memory die (Die 2), the defect information table 1121 may include the address of the second memory die (Die 2) and the address ADDR1' of memory cells in which defects have occurred in the high-temperature operating environment. Similarly, for memory cells included in the third memory die (Die 3), the defect information table 1121 may include the address of the third memory die (Die 3) and the address ADDR3' of memory cells in which defects have occurred in the high-temperature operating environment. Similarly, for memory cells included in the N-th memory die (Die N), the defect information table 1121 may include the address of the N-th memory die (Die N) and the address ADDR7' of memory cells in which defects have occurred in the high-temperature operating environment.

Further, referring to FIG. 5, a first memory die (Die 1) may be a normal memory die in which no defects have occurred even though the operating temperature changes.

FIG. 6 is a diagram illustrating a defect information table according to an embodiment of the present disclosure.

Referring to FIG. 6, a defect information table 1121 may include process information indicating whether memory cells are in a fast-operating state or a slow-operating state depending on process parameters. Also, the defect information table 1121 may include process information about respective memory dies.

In an embodiment, a first memory die (Die 1) and an N-th memory die (Die N) may be manufactured on different wafers. Therefore, in respective operating environments, depending on the process parameters, the operating states of the first memory die (Die 1) and the N-th memory die (Die N) may be different from each other.

In an embodiment, the first memory die (Die 1) may be in a state in which memory cells are operating fast in low-voltage and low-temperature states. Further, the first memory die (Die 1) may be in a state in which memory cells are operating in a normal mode in low-voltage and normal-temperature states. Furthermore, the first memory die (Die 1) may be in a state in which memory cells are operating in the normal mode in low-voltage and high-temperature states.

In an embodiment, the first memory die (Die 1) may be in a state in which memory cells are operating fast in normal-voltage and low-temperature states. Further, the first memory die (Die 1) may be in a state in which memory cells are operating fast in normal-voltage and normal-temperature states. Furthermore, the first memory die (Die 1) may be in a state in which memory cells are operating in the normal mode in normal-voltage and high-temperature states.

In an embodiment, the first memory die (Die 1) may be in a state in which memory cells are operating slowly in high-voltage and low-temperature states. Further, the first memory die (Die 1) may be in a state in which memory cells are operating fast in high-voltage and normal-temperature states. Furthermore, the first memory die (Die 1) may be in a state in which memory cells are operating fast in high-voltage and high-temperature states.

In an embodiment, an N-th memory die (Die N) may be in a state in which memory cells are operating slowly in low-voltage and low-temperature states. Furthermore, the N-th memory die (Die N) may be in a state in which memory cells are operating fast in low-voltage and normal-temperature states. Furthermore, the N-th memory die (Die N) may be in a state in which memory cells are operating in the normal mode in low-voltage and high-temperature states.

In an embodiment, the N-th memory die (Die N) may be in a state in which memory cells are operating fast in normal-voltage and low-temperature states. Furthermore, the N-th memory die (Die N) may be in a state in which memory cells are operating fast in normal-voltage and normal-temperature states. Furthermore, the N-th memory die (Die N) may be in a state in which memory cells are operating fast in normal-voltage and high-temperature states.

In an embodiment, the N-th memory die (Die N) may be in a state in which memory cells are operating fast in high-voltage and low-temperature states. Further, the N-th memory die (Die N) may be in a state in which memory cells are operating fast in high-voltage and normal-temperature states. Furthermore, the N-th memory die (Die N) may be in a state in which memory cells are operating fast in high-voltage and high-temperature states.

A memory controller 1130 illustrated in FIG. 2 may allocate memory dies based only on the defect information related to voltage illustrated in FIG. 4. In an embodiment, the memory controller 1130 illustrated in FIG. 2 may allocate memory dies based only on the defect information related to temperature illustrated in FIG. 5. In an embodiment, the memory controller 1130 illustrated in FIG. 2 may allocate memory dies in consideration of all of the voltage, temperature, and process information illustrated in FIG. 6.

For example, assuming that memory dies are allocated in a normal voltage environment only based on defect information related to voltage, as illustrated in FIG. 4, no defects have occurred in the N−1-th memory die (Die N−1) in the normal voltage environment. Thus, the memory controller 1130 may allocate the N−1-th memory die (Die N−1). Further, when the memory controller 1130 allocates memory dies only based on the defect information related to voltage, the memory controller 1130 may allocate the N−1-th memory die (Die N−1) even though defects have occurred in the N−1-th memory die (Die N−1) in a normal temperature environment, as illustrated in FIG. 5.

For example, it is assumed that memory dies are allocated in a normal temperature environment only based on defect information related to temperature. As illustrated in FIG. 5, no defects have occurred in the second memory die (Die 2) in the normal temperature environment, and thus the memory controller 1130 may allocate the second memory die (Die 2). Because the memory controller 1130 allocates memory dies only based on defect information related to temperature, the memory controller 1130 may allocate the second memory die (Die 2) even though defects have occurred in the second memory die (Die 2) in the normal voltage environment, as illustrated in FIG. 4.

For example, it is assumed that memory dies are allocated in consideration of all of the defect information related to voltage, the defect information related to temperature, and the process information. The memory controller 1130 may first allocate a memory die in a fast operating state from among memory dies in which no defects have occurred in a memory condition at the time at which memory dies are allocated.

Figure 7:
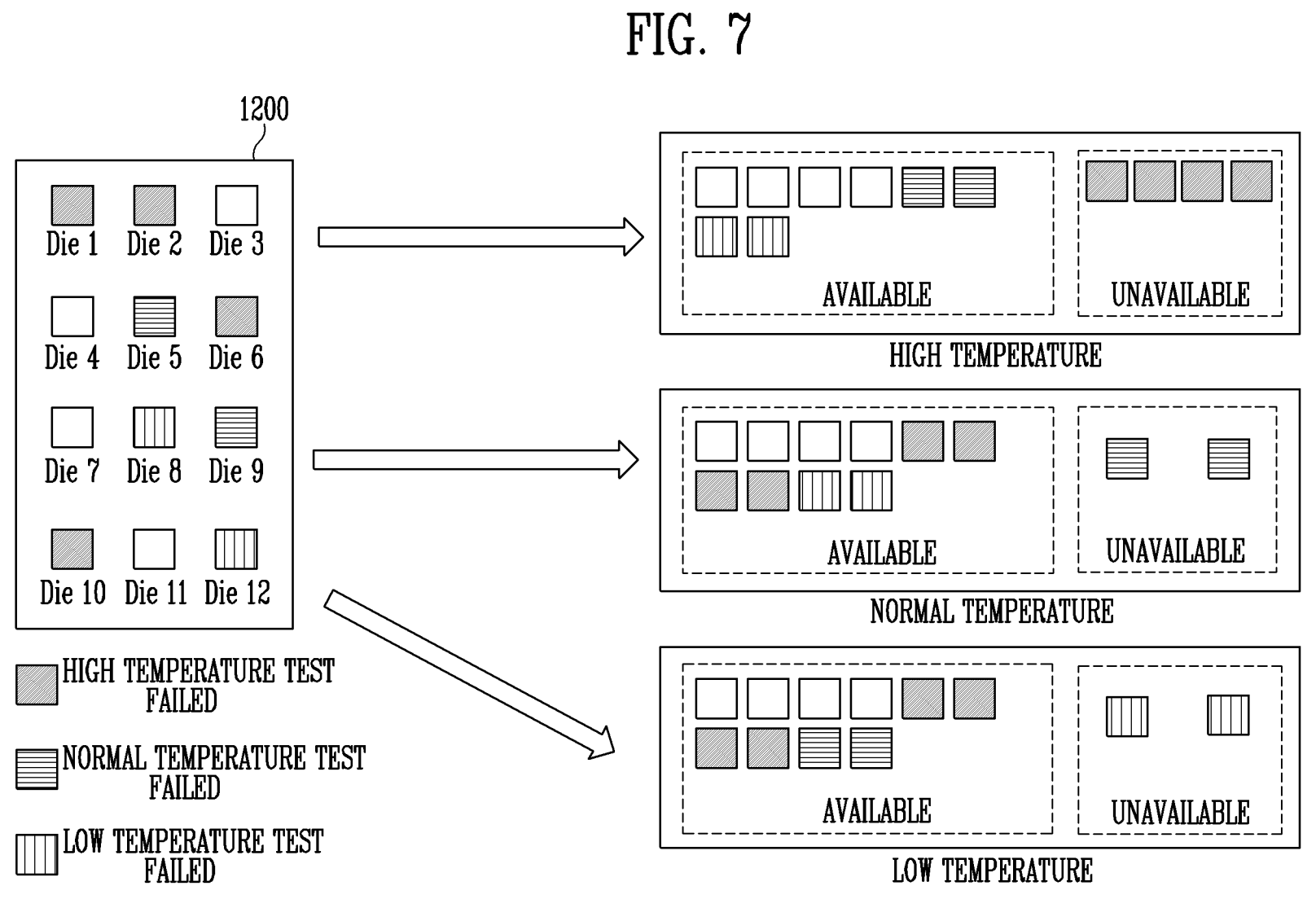

FIG. 7 is a diagram illustrating a process of dynamically allocating memory dies based on temperature according to an embodiment of the present disclosure.

A memory controller 1130 illustrated in FIG. 2 may allocate memory dies required for operation, from among a plurality of memory dies included in a volatile storage area 1200, based on defect information related to temperature.

Among 12 memory dies included in the volatile storage area 1200, first, second, sixth, and tenth memory dies (Die 1, 2, 6, and 10) may include memory cells in which defects have occurred in a high-temperature operating environment. Similarly, fifth and ninth memory dies (Die 5 and 9) may include memory cells in which defects have occurred in a normal-temperature operating environment. Similarly, eighth and twelfth memory dies (Die 8 and 12) may include memory cells in which defects have occurred in a low-temperature operating environment. In addition, third, fourth, seventh, and eleventh memory dies (Die 3, 4, 7, and 11) may be normal memory dies in which no defects have occurred.

A state detector 1110 illustrated in FIG. 2 may monitor a memory condition, and may provide the result of monitoring to the memory controller 1130. The memory controller 1130 may check memory dies in which defects have occurred based on memory conditions with reference to a defect information table 1121.

In an embodiment, a temperature detector 1112 included in the state detector 1110 may detect the temperature of the storage device, and may generate temperature information based on the detected temperature. For example, the temperature detector 1112 may detect the temperature of the storage device, and may generate temperature information including information indicating whether the detected temperature corresponds to a low-temperature environment, a normal-temperature environment, or a high-temperature environment.

The memory controller 1130 illustrated in FIG. 2 may check the memory dies in which defects have occurred in the memory condition based on the temperature information.

In an embodiment, when the memory condition corresponds to a high temperature operating environment, such as for example detected by the temperature detector 1112, the memory controller 1130 may allocate the memory dies (e.g., Die 3, 4, 5, 7, 8, 9, 11, and 12) other than the memory dies (e.g., Die 1, 2, 6, and 10) in which defects have occurred in the high-temperature operating environment.

In an embodiment, when the memory condition corresponds to a normal-temperature operating environment, the memory controller 1130 may allocate the memory dies (e.g., Die 1, 2, 3, 4, 6, 7, 8, 10, 11, and 12) other than the memory dies (e.g., Die 5 and 9) in which defects have occurred in the normal-temperature operating environment.

In an embodiment, when the memory condition corresponds to a low-temperature operating environment, the memory controller 1130 may allocate the memory dies (e.g., Die 1, 2, 3, 4, 5, 6, 7, 9, 10, and 11) other than the memory dies (e.g., Die 8 and 12) in which defects have occurred in the low-temperature operating environment.

Figure 8:
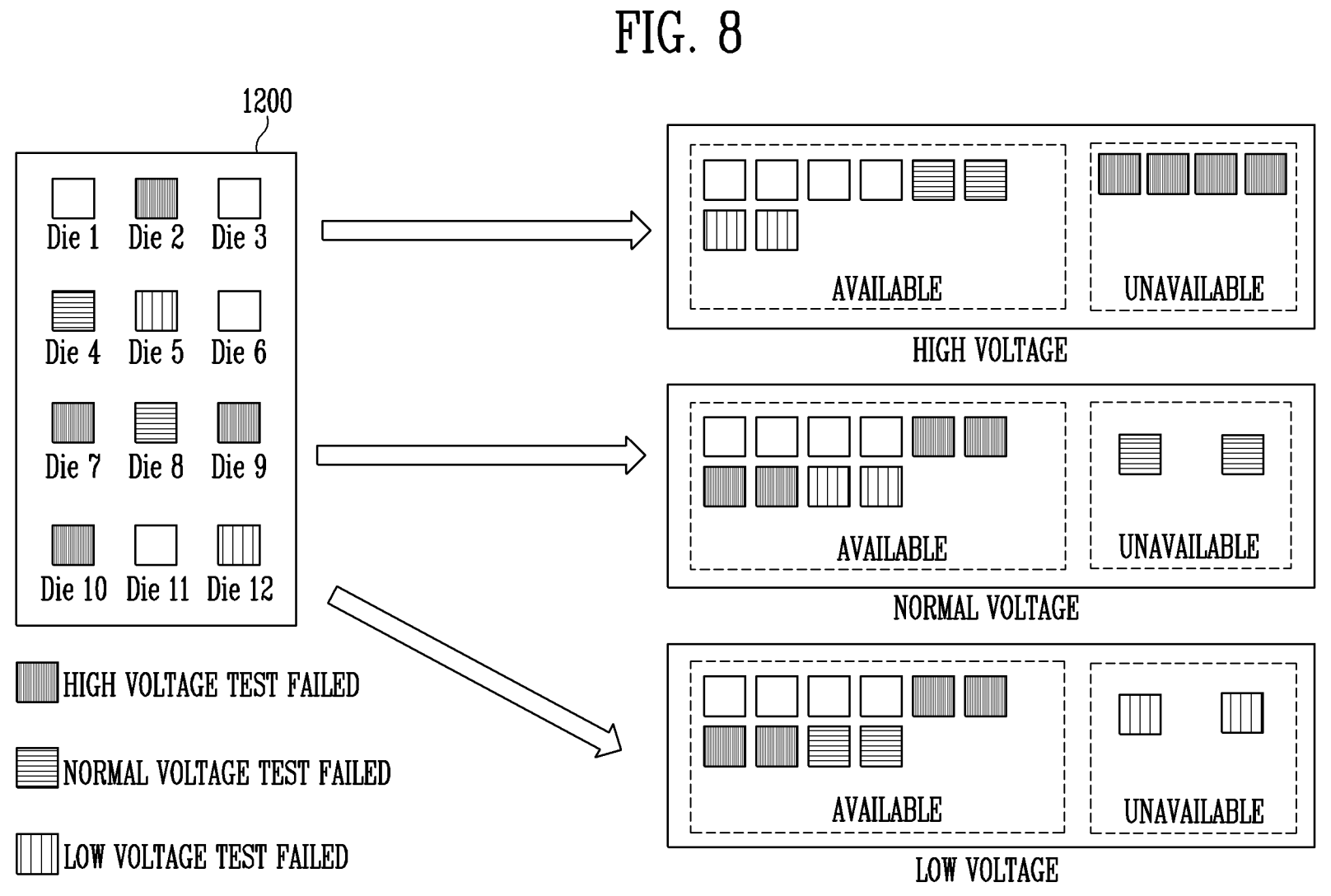

FIG. 8 is a diagram illustrating a process of dynamically allocating memory dies based on voltage according to an embodiment of the present disclosure.

A memory controller 1130 illustrated in FIG. 2 may allocate memory dies required for operation from among a plurality of memory dies included in a volatile storage area 1200, based on defect information related to voltage.

Among 12 memory dies included in the volatile storage area 1200, second, seventh, ninth, and tenth memory dies (e.g., Die 2, 7, 9, and 10) may include memory cells in which defects have occurred in a high-voltage operating environment. Similarly, fourth and eighth memory dies (e.g., Die 4 and 8) may include memory cells in which defects have occurred in a normal-voltage operating environment. Similarly, fifth and twelfth memory dies (e.g., Die 5 and 12) may include memory cells in which defects have occurred in a low-voltage operating environment. The remaining memory dies, that is, first, third, sixth and eleventh memory dies (e.g., Die 1, 3, 6, and 11) may be normal memory dies in which no defects have occurred.

A state detector 1110 illustrated in FIG. 2 may monitor a memory condition, and may provide the result of monitoring to the memory controller 1130. The memory controller 1130 may check memory dies in which defects have occurred based on the memory condition with reference to a defect information table 1121.

In an embodiment, a voltage detector 1111 included in the state detector 1110 may detect an applied operating voltage, and may generate voltage information based on the detected voltage. For example, the voltage detector 1111 may detect the operating voltage applied to the memory dies, and may generate voltage information, including information indicating whether the detected voltage corresponds to a low-voltage environment, a normal-voltage environment, or a high-voltage environment.

The memory controller 1130 illustrated in FIG. 2 may check the memory dies in which defects have occurred in the memory condition, based on the voltage information.

In an embodiment, when the memory condition corresponds to a high-voltage operating environment, the memory controller 1130 may allocate the memory dies (e.g., Die 1, 3, 4, 5, 6, 8, 11, and 12) other than the memory dies (e.g., Die 2, 7, 9, and 10) in which defects have occurred in the high-voltage operating environment.

In an embodiment, when the memory condition corresponds to a normal-voltage operating environment, the memory controller 1130 may allocate the memory dies (e.g., Die 1, 2, 3, 5, 6, 7, 9, 10, 11, and 12) other than the memory dies (e.g., Die 4 and 8) in which defects have occurred in the normal-voltage operating environment.

In an embodiment, when the memory condition corresponds to a low-voltage operating environment, the memory controller 1130 may allocate the memory dies (e.g., Die 1, 2, 3, 4, 6, 7, 8, 9, 10, and 11) other than the memory dies (e.g., Die 5 and 12) in which defects have occurred in the low-voltage operating environment.

Figure 9:
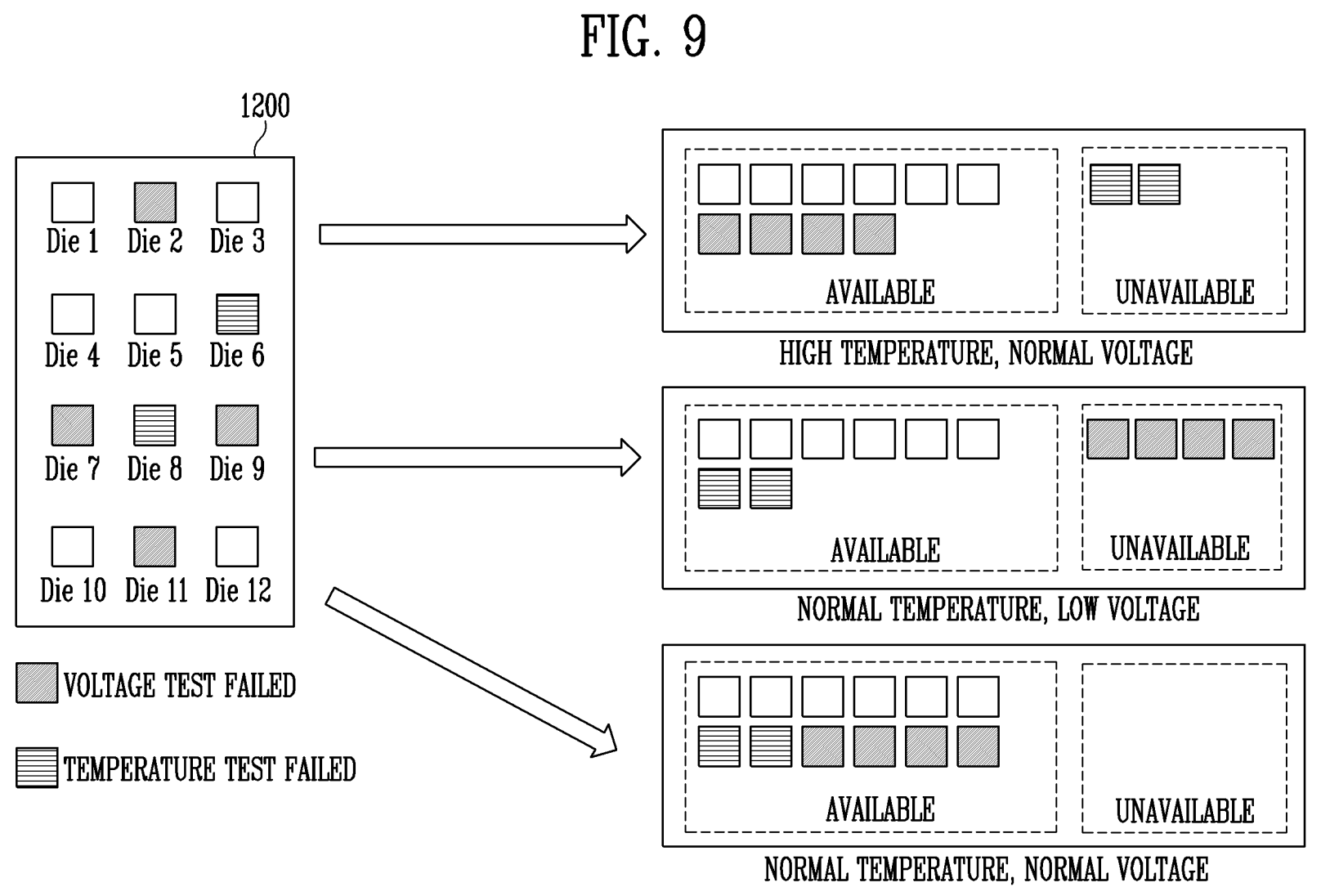

FIG. 9 is a diagram illustrating a process of dynamically allocating memory dies based on temperature and voltage according to an embodiment of the present disclosure.

A memory controller 1130 illustrated in FIG. 2 may allocate memory dies required for operation, from among a plurality of memory dies included in the volatile storage area 1200, based on defect information related to voltage and defect information related to temperature.

In an embodiment, among 12 memory dies included in a volatile storage area 1200, second, seventh, ninth, and eleventh memory dies (e.g., Die 2, 7, 9, and 11) may be memory dies that are normally operating only in a normal-voltage operating environment. Further, sixth and eighth memory dies (e.g., Die 6 and 8) may include memory dies that are normally operating only in a normal-temperature operating environment. The remaining memory dies, that is, first, third, fourth, fifth, tenth, and twelfth memory dies, may be normal memory dies in which no defects have occurred.

A state detector 1110 illustrated in FIG. 2 may monitor a memory condition, and may provide the result of monitoring to the memory controller 1130. The memory controller 1130 may check memory dies in which defects have occurred based on the memory condition with reference to a defect information table 1121.

In an embodiment, a temperature detector 1112 included in the state detector 1110 may detect the temperature of the storage device, and may generate temperature information based on the detected temperature. For example, the temperature detector 1112 may detect the temperature of the storage device, and may generate temperature information including information indicating whether the detected temperature corresponds to a low-temperature environment, a normal-temperature environment, or a high-temperature environment.

In an embodiment, a voltage detector 1111 included in the state detector 1110 may detect an applied operating voltage, and may generate voltage information based on the detected voltage. For example, the voltage detector 1111 may detect the operating voltage applied to the memory dies, and may generate voltage information including information indicating whether the detected voltage corresponds to a low-voltage environment, a normal-voltage environment, or a high-voltage environment.

In an embodiment, when the memory condition corresponds to a high-temperature and normal-voltage operating environment, the memory controller 1130 may allocate the memory dies (e.g., Die 1, 2, 3, 4, 5, 7, 9, 10, 11, and 12) other than the memory dies (e.g., Die 6 and 8) in which defects have occurred in the high-temperature operating environment.

In an embodiment, when the memory condition corresponds to a low-voltage and normal-temperature operating environment, the memory controller 1130 may allocate the memory dies (e.g., Die 1, 3, 4, 5, 6, 8, 10, and 12) other than the memory dies (e.g., Die 2, 7, 9, and 11) in which defects have occurred in the low-voltage operating environment.

In an embodiment, when the memory condition corresponds to a normal-temperature and normal-voltage operating environment, the memory controller 1130 may allocate all memory dies. When allocating memory dies, the memory controller 1130 may first allocate normal memory dies.

Figure 10:
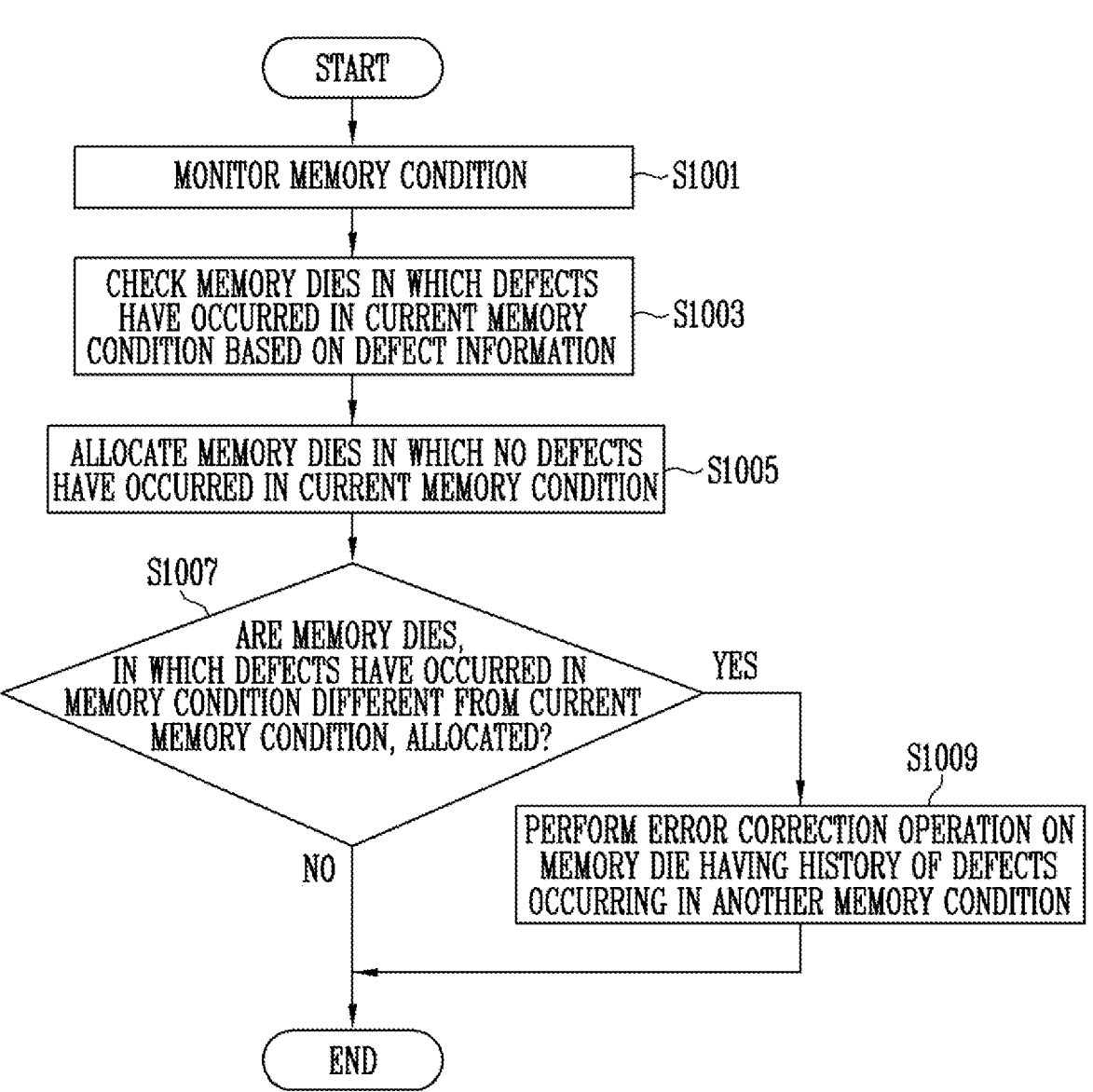
FIG. 10 is a flowchart illustrating a method of operating a controller according to an embodiment of the present disclosure.

FIG. 10 is a flowchart illustrating a method of operating a controller according to an embodiment of the present disclosure.

At step S1001, a controller may monitor a memory condition.

The memory condition may include temperature, applied operating voltage, etc. The controller may monitor the memory condition in real time, and may monitor the memory condition at preset intervals.

At step S1003, the controller may check memory dies in which defects have occurred in the current memory condition based on defect information. The defect information may include at least one of an information about temperature, voltage, and process corresponding to an environment in which a defect has occurred in defective memory dies.

At step S1005, the controller may allocate memory dies in which no defects have occurred in the current memory condition. Here, the allocated memory dies may be normal memory dies having no history in which defects have occurred in the current memory condition, or may be memory dies in which defects have occurred in a memory condition other than the current memory condition.

At step S1007, the controller may check whether memory dies in which defects have occurred in an additional memory condition, which is different from the current memory condition, are allocated from among the allocated memory dies. If the allocated memory dies include defects that have occurred in a different memory condition, then controller may perform an error correction operation when data is stored in the allocated memory dies even though no defects have occurred in the current memory condition, at step S1009.

Figure 11:
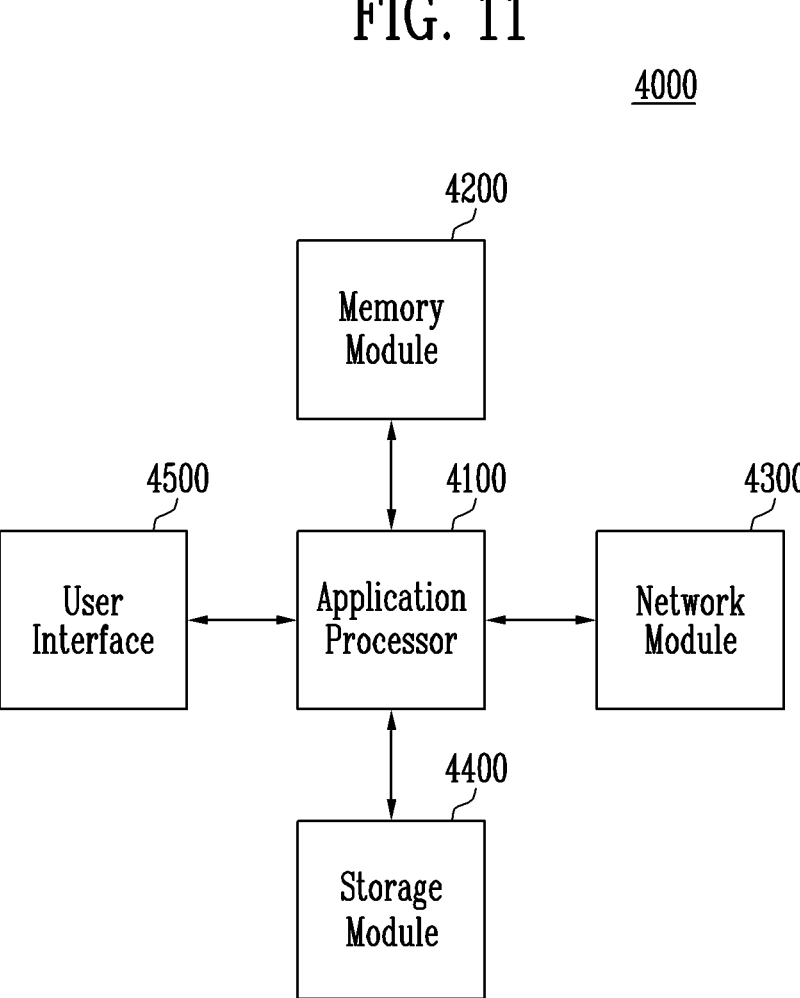
FIG. 11 is a diagram illustrating a user system to which a storage device according to an embodiment of the present disclosure is applied.

FIG. 11 is a diagram illustrating a user system to which a storage device according to an embodiment of the present disclosure is applied.

Referring to FIG. 11, a user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided in the form of a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDARM, LPDDR2 SDRAM, and LPDDR3 SDRAM or nonvolatile RAMs such as PRAM, ReRAM, MRAM, and FRAM. In an embodiment, the application processor 4100 and the memory module 4200 may be packaged based on a package-on-package (POP), and may then be provided as a single semiconductor package.

The network module 4300 may communicate with external devices. In an embodiment, the network module 4300 may support wireless communication, such as code division multiple access (CDMA), global system for mobile communication (GSM), wideband CDMA (WCDMA), CDMA-2000, time division multiple access (TDMA), long term evolution (LTE), Wimax, wireless LAN (WLAN), UWB, Bluetooth, or Wi-Fi. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100.

In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a 3D structure. In an embodiment, the storage module 4400 may be provided as a removable storage medium (removable drive), such as a memory card or an external drive of the user system 4000.

In an embodiment, the storage module 4400 may include a plurality of nonvolatile memory devices, each of which may be operated in the same manner as the nonvolatile storage area, described above with reference to FIG. 1. The storage module 4400 may be operated in the same manner as the storage device 1000, described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as an a liquid crystal display (LCD), an organic light-emitting diode (OLED) display device, an active matrix OLED (AMOLED) display device, an LED, a speaker, and a monitor.

The present disclosure may provide an electronic device that is capable of dynamically allocating a memory depending on temperature and voltage changes, and a method of operating the storage device.

What is claimed is:

1. A storage device, comprising:
a plurality of memory dies;
a memory controller;
a memory information storage configured to store a defect information for each of the plurality of memory dies in which defects have occurred; and
a state detector configured to detect a memory state for each of the plurality of memory dies, wherein the memory controller is configured to receive an externally provided operation request and to allocate required memory dies in response to the operation request,
wherein the memory controller allocates the required memory dies based on a comparison between the stored defect information of the required memory dies and the memory states of the required memory dies detected by the state detector when the memory controller receives the operation request, and
wherein the memory controller excludes from allocation memory dies with stored defect information corresponding to an environment of the detected memory states.

2. The storage device according to claim 1, further comprising:
an error corrector configured to correct an error in the allocated required memory dies with stored defect information corresponding to an environment other than the environment of the detected memory states.

3. The storage device according to claim 1, wherein the state detector comprises:
a temperature detector configured to detect a temperature of the storage device and generate temperature information based on the detected temperature; and
a voltage detector configured to detect an operating voltage applied to each of the plurality of memory dies and generate voltage information based on the detected operating voltage.

4. The storage device according to claim 3, wherein the defect information includes at least one of an address of a defective memory die in which a defect has occurred in a wafer test process, an address of a memory block in which the defect has occurred from among a plurality of memory blocks included in the defective memory die, an address of a page in which the defect has occurred from among a plurality of pages included in the defective memory die, and an address of defective memory cells included in the defective memory die.

5. The storage device according to claim 4, wherein the memory controller is configured to obtain information related to a memory die in which a defect has occurred at a temperature corresponding to the temperature information based on the defect information, and to exclude, from allocation, the memory die in which the defect has occurred at the temperature corresponding to the temperature information.

6. The storage device according to claim 4, wherein the memory controller is configured to obtain information related to a memory die in which a defect has occurred at a voltage corresponding to the voltage information based on the defect information, and to exclude, from allocation, the memory die in which the defect has occurred at the voltage corresponding to the voltage information.

7. The storage device according to claim 4, wherein the memory controller is configured to exclude, from the allocation, a memory die in which a defect has occurred at a temperature or a voltage corresponding to the temperature information or the voltage information, and to allocate a memory die having a fast operating state based on process information of memory dies, other than memory dies excluded from the allocation from among the plurality of memory dies.

8. The storage device according to claim 1, wherein each of the plurality of memory dies includes at least one of a volatile memory or a nonvolatile memory.

9. The storage device according to claim 1, wherein the memory controller is configured to, when a defect occurs in any one of the allocated required memory dies while performing an operation on the allocated required memory dies, obtain a memory state at a time at which the defect occurs from the state detector, and update the defect information based on the obtained memory state.

10. The storage device according to claim 1, wherein the memory controller is configured to first allocate a memory die in which no defects have occurred in a wafer test process, from among the plurality of memory dies, and subsequently allocate a memory die in which no defects have occurred in a memory state detected by the state detector.

11. A controller, comprising:

a memory information storage configured to store defect information related to an address of a memory die in which a defect has occurred based on a result of a wafer test and a first memory condition in which the defect has occurred in the memory die;

a state detector configured to detect a current memory condition including a temperature of a storage device and an operating voltage applied to the storage device;

a memory controller configured to allocate, for an external operation request, memory dies in which no defects have occurred in the current memory condition and to exclude from allocation memory dies in which defects have occurred in the current memory condition; and an error detector configured to perform an error correction operation on an allocated memory die in which a defect has occurred in a second memory condition different from the first memory condition, from among memory dies in which no defects have occurred in the first memory condition.

12. The controller according to claim 11, wherein the memory information storage comprises:

a first table configured to store information about defective memories occurring depending on a change in an operating temperature;

a second table configured to store information about defective memories occurring depending on a change in the operating voltage; and a third table configured to store information about an operation mode of memory cells depending on changes in the operating temperature and the operating voltage.

13. The controller according to claim 12, wherein the memory controller is configured to allocate the memory dies based on at least one of the first table and the second table.

14. The controller according to claim 12, wherein the memory controller is configured to first allocate a memory die in which no defects have occurred in the wafer test, from among the memory dies, and subsequently allocate a memory die in which no defects have occurred in the current memory state detected by the state detector.

15. A method of operating a controller, comprising:

monitoring a current operating temperature of a storage device and a current operating voltage applied to the storage device;

checking addresses of memory dies in which defects previously occurred at either the current temperature or the current voltage;

allocating memory dies for an external operation request while excluding, from allocation, memory dies in which defects previously occurred at either the current temperature or the current voltage; and performing an error correction operation on a memory die, from among the allocated memory dies, in which a defect previously occurred at a temperature and a voltage different from the current temperature and voltage.

16. The method according to claim 15, wherein allocating the memory die comprises:

allocating a memory die in which no defects have occurred; and allocating a memory die in which no defects have occurred at the current temperature and voltage.

* * * * *